United States Patent [19]

Ogawa et al.

[11] 4,156,050

[45] May 22, 1979

[54] PIEZOELECTRIC CRYSTALLINE FILMS AND METHOD OF PREPARING THE SAME

[75] Inventors: Toshio Ogawa, Nagaokakyo; Tasuku Mashio, Nagaokakyo; Hiroshi Nishiyama, Mukou, all of Japan

[73] Assignee: Murata Manufacturing Co., Ltd., Japan

[21] Appl. No.: 874,392

[22] Filed: Feb. 2, 1978

[30] Foreign Application Priority Data

Feb. 2, 1977 [JP] Japan ................................ 52-11060

[51] Int. Cl.$^2$ ..................... C23C 15/00; C04B 35/00
[52] U.S. Cl. .............................. 428/432; 204/192 SP; 252/62.9; 427/100; 428/469; 428/539
[58] Field of Search ............... 204/192 SP; 252/62.9; 427/100; 428/432, 469, 539

[56] References Cited

U.S. PATENT DOCUMENTS 3,766,041  10/1973  Wasa et al. .......................... 252/62.9
3,988,232  10/1976  Wasa et al. ...................... 204/192 SP

OTHER PUBLICATIONS

Hausmann et al., "Chem. Abstracts", vol. 72, 1970, 26902g.

*Primary Examiner*—Jack Cooper
*Attorney, Agent or Firm*—Birch, Stewart, Kolasch and Birch

[57] ABSTRACT

Piezoelectric crystalline films which consist essentially of a crystalline zinc oxide film with a c-axis perpendicular to a substrate surface, containing 0.01 to 20.0 atomic percent of vanadium. These films are prepared by radio-frequency sputtering.

4 Claims, 3 Drawing Figures

PIEZOELECTRIC CRYSTALLINE FILMS AND METHOD OF PREPARING THE SAME

BACKGROUND AND SUMMARY OF THE INVENTION

The present invention relates to piezoelectric crystalline films. More particularly, it relates to piezoelectric crystalline films comprising zinc oxide having a hexagonal crystal structure.

There are many methods for making piezoelectric zinc oxide films such as, for example, vacuum deposition methods, epitaxial growth methods, and sputtering methods. Among these methods, the sputtering methods, particularly, a radio-frequency sputtering method has been used very often lately because of a advantage that a growing rate of oriented crystalline films is high, thus making it possible to mass-produce piezoelectric crystalline films industrially.

When making a piezoelectric crystalline film of zinc oxide on a substrate surface by the radio-frequency sputtering method, ceramics of highly pure zinc oxide has been conventionally used as a source of the film material. However, even when radio-frequency sputtering is effected with such a film material source, it results in the formation of a crystalline film with a rough surface, thus making it impossible to produce a good piezoelectric crystalline film. In addition, it is difficult with such a film material source to make a c-axis perpendicularly with respect to the substrate surface. If a piezoelectric crystalline film of zinc oxide has a rough surface, various disadvantages occur. For example, when manufacturing an acoustic surface wave filter with such a zinc oxide film, it is difficult to form interdigital transducers on the film surface, and the produced acoustic surface wave filter tends to have the disconnection of interdigital transducers, and possess a large propagation loss of acoustic surface waves. Also, if the c-axis of the zinc oxide film is inclined with respect to the axis perpendicular to the substrate surface, the value of the electromechanical coupling factor becomes small, thus making it difficult to produce a piezoelectric crystalline film transducer with good conversion efficiency.

It has now been found that the use of ceramics of zinc oxide containing vanadium makes it possible to produce a piezoelectric crystalline film with a c-axis perpendicular to the substrate surface and a smooth surface.

It is an object of the present invention to provide an improved zinc oxide piezoelectric crystalline film which overcomes the aforesaid disadvantages.

According to the present invention, there is provided a piezoelectric crystalline film of zinc oxide with a c-axis perpendicular to the substrate surface, characterized in that said crystalline film contains 0.01 to 20.0 atomic percent of vanadium.

The piezoelectric crystalline film of the present invention may be made by any conventional methods such as for example, the radio-frequency sputtering methods, the co-sputtering methods and the ion implanting methods.

BRIEF DESCRIPTION OF THE DRAWINGS

The present invention will be further apparent from the following description with respect to examples and the accompanying drawings, wherein:

Referring now to FIG. 1, there is shown a radio-frequency sputtering apparatus with two electrodes which is used for making piezoelectric crystalline films according to the present invention. The apparatus comprises a bell jar 1 in which a pair of electrodes, i.e., a planar cathode 2 and a planar anode 3 are positioned in parallel. Fixed on the cathode 2 is a film material source 4 consisting essentially of ceramics of zinc oxide containing vanadium. A shutter 5 is positioned between electrodes 2 and 3. A substrate 6 of glass or metal is fixed to the bottom of the anode 3. The substrate 6 is heated to a temperature of 200° to 500° C. during sputtering. A vent 7 and a gas inlet 8 are provided to the bell jar.

Figure 1:
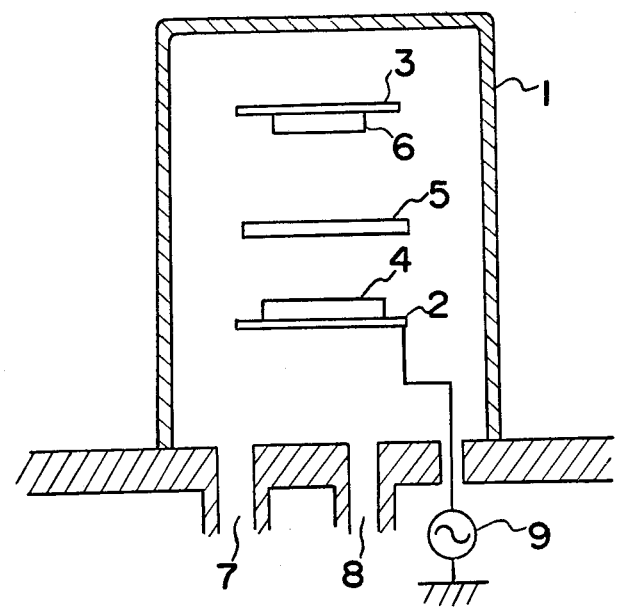
FIG. 1 is a diagrammatic view of the radio-frequency sputtering apparatus used for making piezoelectric crystalline films according to the present invention.

The radio-frequency sputtering is effected in the following manner: After making airtight, the bell jar 1 is evacuated through the vent 7 to a pressure not higher than $1 \times 10^{-6}$ Torrs, and then supplied with argon or oxygen gas or a mixed gas of argon and oxygen through the gas inlet 8 thereby adjusting the pressure to $1 \times 10^{-1}$ to $1 \times 10^{-3}$ Torrs. The cathode 2 is supplied with a radio-frequency voltage by the radio-frequency electric power source 9. An electric power of 2 to 8 W/cm² is applied to the film material source 4.

The film material source 4 consisting essentially of ceramics of zinc oxide containing vanadium is prepared in the following manner:

Using powder of ZnO and $V_2O_5$ as raw materials, there are prepared mixtures each having a compositional proportion shown in Table 1. Each of the mixtures is milled by the wet process, dried and then presintered at 600° to 800° C. for 2 hours. The presintered body is crushed, milled by a wet process with an organic binder and then dried. The resultant powder is shaped into discs with a diameter of 100 mm and a thickness of 5 mm at a pressure of 1000 kg/cm² and then fired at 1200° C. for 2 hours to obtain the film source material.

The thus obtained film source material was subjected to measurements of resistivity and percentage of bulk density $d_s$ to theoretical density $d_t$ ($d_s/d_t \times 100$). The results as obtained are shown in Table 1.

Table 1

| Specimen No. | Additive (atom %) V | Material source Resistivity (Ωcm) | $d_s/d_t \times 100$ (%) | Zinc oxide film Orientation x (deg.) | Quality |
|---|---|---|---|---|---|
| 1 | — | $8.6 \times 10$ | 85.0 | 5.8 | Rough |
| 2 | 0.01 | $9.3 \times 10^6$ | 97.4 | 0.9 | Smooth |
| 3 | 0.1 | $1.7 \times 10^7$ | 99.5 | 1.6 | " |
| 4 | 5.0 | $6.6 \times 10^7$ | 98.2 | 2.3 | " |

Using the respective film material sources obtained, zinc oxide piezoelectric crystalline films are made on glass substrates with the aforesaid radio-frequency sputtering apparatus. The radio-frequency sputtering is carried out under the following conditions: A mixed gas of 90 vol% of argon and 10 vol% of oxygen is supplied to the bell jar 1 through the gas inlet 8, thereby adjusting the pressure in the bell jar 1 to $2 \times 10^{-3}$ Torrs. The glass substrate is heated to and maintained at 350° C. An electric power of 6 W/cm² with a frequency of 13.56 MHz is applied between the bell jar 1 and the film material source 4.

The c-axis orientation of thus obtained piezoelectric crystalline films was measured with a locking curve method by X-ray diffraction (Ref.: Minakata, Chubachi and Kikuchi "Quantitative Representation of c-axis Orientation of Zinc Oxide Piezoelectric Thin Films" The 20th Lecture of Applied Physics Federation (Japan). vol. 2 (1973) page 84; and Makoto Minakata, The Tohoku University Doctor's Thesis (1974)). The mean value ($\bar{X}$) of the angle of the c-axis with respect to the axis perpendicular to the substrate surface was obtained from respective specimens. The results are shown in Table 1. The quality of the crystalline films are also shown in Table 1.

As is evident from Table 1, the crystalline films according to the present invention have a c-axis approximately perpendicular to the substrate surface and a smooth surface. Thus, it will be understood that according to the present invention it is possible to produce excellent piezoelectric crystalline films with a large electromechanical coupling factor.

Figure 2:
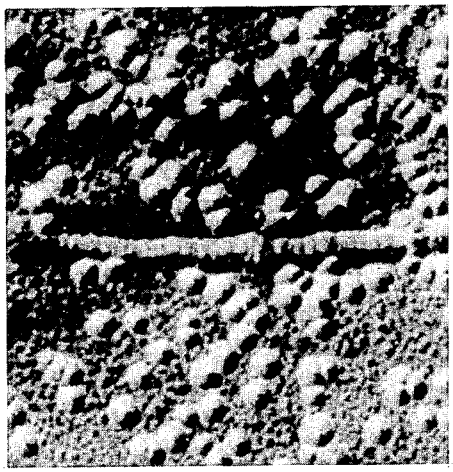
FIG. 2 is an electron micrograph of a conventional crystalline piezoelectric zinc oxide film.

Specimens Nos. 1 and 3 were photographed through a scanning electron microscope at a magnification of 1000. FIG. 2 is an electron micrograph of the specimen No. 1 and FIG. 3 is that of the specimen No. 3.

Figure 3:
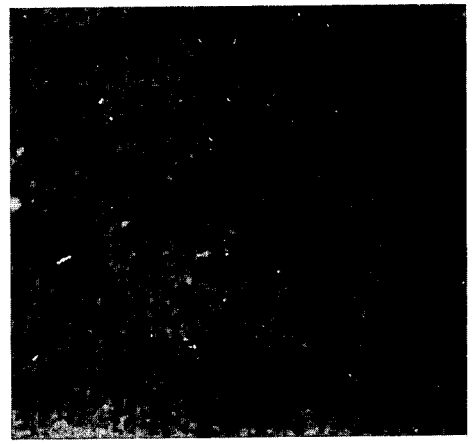
FIG. 3 is an electron micrograph of a piezoelectric crystalline film of the present invention.

As is evident from these figures, the conventional piezoelectric crystalline films possess a rough surface (cf. FIG. 2), while the piezoelectric crystalline films of the present invention possess a smooth surface (cf. FIG. 3).

In the above examples, vanadium is used in the oxide form, but any other form such as metal, compounds or alloys thereof may be used as a raw material for preparing film material sources. In such cases, the same results can be obtained if vanadium be contained in the resultant zinc oxide piezo-electric crystalline film. The concentration of vanadium in the sputtered zinc oxide films according to the present invention ranges from 0.01 to 20.0 atomic percent. Because, if the concentration of vanadium is less than 0.01 atomic percent, the surface of the resultant crystalline films become rough, and if the concentration of vanadium is more than 20.0 atomic percent, the direction of the crystallographic orientation of the zinc oxide films can not be well controlled, resulting in a disadvantageous in the orientation of the zinc oxide films.

It has been found that by the use of the film material source containing vanadium the following advantages can be obtained.

When mass-producing piezoelectric crystalline films industrially by the radio-frequency sputtering methods, it is necessary to increase the growing rate of the crystalline film. In such case, the electric power supplied to the film material source per unit area thereof must be increased so that it is required to have a high bulk density. This requirement is fully met by the film material source containing vanadium. As is evident from Table 1, the film material sources used in the present invention have a bulk density higher than the conventionally used sources so that the film material sources containing vanadium make it possible to mass-produce zinc oxide piezoelectric crystalline films by the use of high electric powers.

What is claimed is:

1. A piezoelectric crystalline film having a smooth surface and disposed on a substrate, consisting essentially of a crystalline zinc oxide film with a hexagonal crystal structure and a c-axis substantially perpendicular to the substrate surface, characterized in that said crystalline zinc oxide film contains 0.01 to 20.0 atomic percent of vanadium.

2. The piezoelectric crystalline film of claim 1, wherein the substrate is selected from the group consisting of metal and glass.

3. A method for making piezoelectric crystalline films having a smooth surface comprising simultaneously sputtering zinc oxide and vanadium from a film material source onto a metal or glass substrate to form a crystalline zinc oxide film with a hexagonal crystal structure and a c-axis substantially perpendicular to the substrate surface containing 0.01 to 20.0 atomic percent of vanadium, wherein said sputtering is effected by radio-frequency sputtering in an atmosphere of argon, or oxygen, or a mixture of argon and oxygen under a pressure of $1 \times 10^{-1}$ to $1 \times 10^{-3}$ Torr, and wherein said film material source consists essentially of ceramics of zinc oxide containing 0.01 to 20.0 atomic percent of vanadium, said substrate being positioned on an anode placed in parallel with a cathode on which said film material source is positioned, said film material source being supplied with an electric power of 2 to 8 w/cm².

4. The method for making piezoelectric crystalline films according to claim 3, wherein the substrate is heated to a temperature of 200° to 500° C. during sputtering.

* * * * *

UNITED STATES PATENT AND TRADEMARK OFFICE
CERTIFICATE OF CORRECTION

PATENT NO. : 4,156,050
DATED : May 22, 1979
INVENTOR(S) : Toshio OGAWA et al

It is certified that error appears in the above-identified patent and that said Letters Patent are hereby corrected as shown below:

Column 1

Lines 59-60, change "ion implanting methods" to --ion plating methods--.

Signed and Sealed this

First Day of December 1981

[SEAL]

Attest:

Attesting Officer

GERALD J. MOSSINGHOFF

Commissioner of Patents and Trademarks